United States Patent [19]

Nonaka et al.

[11] 4,255,671
[45] Mar. 10, 1981

[54] IIL TYPE SEMICONDUCTOR INTEGRATED CIRCUIT

[75] Inventors: Terumoto Nonaka; Takashi Yoshida; Takeshi Matsuyama, all of Hamamatsu, Japan

[73] Assignee: Nippon Gakki Seizo Kabushiki Kaisha, Hamamatsu, Japan

[21] Appl. No.: 819,405

[22] Filed: Jul. 26, 1977

[30] Foreign Application Priority Data

Jul. 31, 1976 [JP] Japan .................. 51/90860

[51] Int. Cl.³ .................. H01L 27/04; H03K 19/091
[52] U.S. Cl. .................. 307/446; 357/22; 357/23; 357/43; 357/92; 307/459
[58] Field of Search .................. 357/41, 22, 43, 23, 357/86, 46, 92; 307/213

[56] References Cited

U.S. PATENT DOCUMENTS

| | | | |
|---|---|---|---|
| 3,112,411 | 11/1963 | Cook | 357/22 |
| 3,397,326 | 8/1968 | Gallagher et al. | 357/43 |
| 3,510,735 | 5/1970 | Potter | 357/86 |
| 3,693,057 | 9/1972 | Wiedmann | 357/36 |
| 3,766,449 | 10/1973 | Bruchez | 357/86 |
| 3,934,399 | 1/1976 | Nishimura et al. | 357/42 |
| 4,056,810 | 11/1977 | Hart et al. | 357/92 |

FOREIGN PATENT DOCUMENTS 2361172 6/1974 Fed. Rep. of Germany ............ 357/43
1398862 6/1975 United Kingdom .

OTHER PUBLICATIONS

Wolf, *Semiconductors* (Wiley-Interscience, N.Y., 1971), pp. 309 and 315.
Pricer et al., IBM Tech. Discl. Bull., vol. 19, No. 5, Oct. 1976, pp. 1630–1631.

*Primary Examiner*—William D. Larkins
*Attorney, Agent, or Firm*—Cushman, Darby & Cushman

[57] ABSTRACT

In an integrated injection logic (IIL) type semiconductor integrated circuit, an injector transistor is formed with a field effect transistor (FET) and an inverter transistor is formed with a bipolar transistor (BPT). The drain region of the FET is merged into the base region of the BPT. The base of the BPT constitutes a logic input and the collector of the BPT constitutes a logic output. The FET may be either of the junction type or of the insulated gate type. The carrier injection efficiency can be improved to approximately unity over a wide range of the injection current.

6 Claims, 11 Drawing Figures

IIL TYPE SEMICONDUCTOR INTEGRATED CIRCUIT

BACKGROUND OF THE INVENTION (a) Field of the Invention

The present invention relates to a semiconductor integrated circuit, and more particularly to an improvement in an integrated injection logic (IIL) type semiconductor integrated circuit (IC).

(b) Description of the Prior Art

The IIL type IC is a logic IC in which a plurality of inverter transistors have their inputs and outputs connected thereamong to constitute a desired logic, and a plurality of injector transistors are integrated in the same semiconductor wafer to inject carriers into the respective inverter transistors. In the conventional ILL, both the injector transistor and the inverter transistor are formed with bipolar transistors. Due to the carrier storage effect and like effects in the bipolar transistor, the switching speed, power dissipation and clocking or the like have been limited. Improvements particularly in the switching speed and the power dissipation have been desired. FIGS. 1 and 2 show an example of the prior art IIL circuit. In FIG. 1, each of inverter transistors $Qd_1$, $Qd_2$, $Qd_3$, . . . is comprised of an npn-type bipolar transistor having three collectors $C_1$, $C_2$ and $C_3$ (for separate outputs), . . . , a grounded emitter E and a base B connected to a selected collector $C_3$ of the inverter transistor of the preceding stage. More particularly, the wired AND output of the selected collectors of the inverter transistors of the preceding stage is supplied to the base of the inverter transistor. Each of injector transistors $Qi_1$, $Qi_2$, . . . is comprised of a pnp-type bipolar transistor having an injection (emitter) electrode I, a grounded base B and a collector C connected to the base B of the corresponding inverter transistor. Hereunder, the operation of this conventional circuit will be described briefly. Assume now that a positive voltage is applied to the injection (emitter) electrode I of an injector transistor $Qi_1$ and that the inverter transistor $Qd_1$ of the preceding stage is turned off. Then, carriers (holes) are injected from the emitter I of the injector transistor $Qi_1$ to the base B of this injector transistor and collected by the collector C of the injector transistor $Qi_1$ which is the base B of the inverter transistor $Qd_2$ to turn this inverter transistor $Qd_2$ on. When the inverter transistor $Qd_1$ of the preceding stage is turned on, carriers injected from the injector transistor $Qi_1$ are absorbed into (or allowed to flow through) this turned-on inverter transistor $Qd_1$ of the preceding stage and hence the inverter transistor $Qd_2$ is turned off. The respective stages of this IIL circuit operate similarly. It will be apparent that when a wired AND output of a plurality of inverter transistors is connected to the base of the inverter transistor of the next stage, the inverter transistor of the next stage is turned on when all the inverter transistors are turned off and is turned off when any one of the inverter transistors is turned on. Clocking of this IIL type semiconductor integrated circuit is generally performed by applying clock pulses to the injection electrodes I of the injector transistors $Qi_1$, $Qi_2$, . . . .

The switching speed of such an IIL type semiconductor integrated circuit depends on the switching speed of the injector transistors $Qi_1$, $Qi_2$, . . . and the carrier injection efficiency (equal to the common base current gain) $\alpha$ of the injector transistors $Qi_1$, $Qi_2$, . . . . Here, for improving the turn-on speed of the inverter transistors $Qd_1$, $Qd_2$, $Qd_3$, . . . , a sufficient amount of carriers should by injected from the injector transistor into the base region of the inverter transistor. As can be seen from FIG. 9, the carrier injection efficiency $\alpha$ of the injector transistor of the conventional IIL type semiconductor integrated circuit is low, and further rapidly decreases with the increase in the injection current $I_i$ when the injection current $I_i$ exceeds above about 100 $\mu$A. Therefore, an increase in the power loss is inevitable for injecting sufficient carriers. Furthermore, since clocking is performed by applying clocking pulses to the injection electrodes of low impedance, a considerable current and hence power is required for clocking. FIG. 2 shows a partial cross-sectional structure of a conventional IIL type semiconductor integrated circuit having the circuit connection of FIG. 1. In the figure, a semiconductor wafer 10 is comprised of an n-type semiconductor substrate 11 of a low resistivity and an n-type epitaxial semiconductor layer 12 of a relatively high resistivity grown thereon. P-type regions 13 and 14 of a relatively low resistivity are formed in the n-type epitaxial layer 12 by the selective diffusion or like techniques. In the p-type region 14, n-type semiconductor regions 15, 16 and 17 of a further low resistivity are formed by diffusion or like techniques. Metal electrodes 18, 19, 20, 21, 22 and 23 are formed on the lower surface of the semiconductor substrate 11 and on the surfaces of the respective semiconductor regions 13, 14, 15, 16 and 17. Here, numeral 24 denotes an oxide film. The semiconductor regions 12, 13 and 14 constitute the base, the emitter and the collector of the injection transistor $Qi_1$. Also, the semiconductor regions 12, 14 and 15, 16 and 17 constitute the emitter, the base and the collectors of the inverter transistor $Qd_2$.

As can be easily seen from the above-stated structure, part of the carriers injected from the emitter region 13 to the base region 12 of the injector transistor $Qi_1$ is not directed to the collector region 14 of the injector transistor $Qi_1$ but to the substrate 11. For increasing the ratio of carriers arriving at the collector region 14 with respect to the whole carriers injected from the emitter region 13, the base width $W_B$ would be reduced as small as possible. In the bipolar transistor of the lateral structure, however, there naturally lies a limit from the point of manufacture for decreasing the base width $W_B$. This constitutes a factor for decreasing the carrier injection efficiency $\alpha$. Furthermore, in the case when the inverter transistor $Qd_1$ of the preceding stage is turned off, carriers injected from the emitter 13 to the base 12 and reach the collector 14 of the injector transistor raises the collector potential to cause the reverse injection from the collector region 14 to the base region 12 as the amount of carriers directed to this collector increases. On the other hand, since the pn-junction between the emitter region 13 and the base region 12 becomes forwardly and deeply biased to cause injection of many carriers, the role of the resistance of the base region 12 becomes large and the ratio of carriers into the semiconductor substrate 11 increases. This forms a reason for the rapid drop of the carrier injection efficiency $\alpha$ with the increase of the injected current $I_i$.

SUMMARY OF THE INVENTION

An object of this invention, therefore, is to provide an integrated injection logic type semiconductor integrated circuit having a novel structure which overcomes the drawbacks of the conventional integrated injection logic type semiconductor integrated circuit.

Another object of the present invention is to provide an integrated injection logic type semiconductor integrated circuit having an improved switching speed.

A further object of the present invention is to provide an integrated injection logic type semiconductor integrated circuit of reduced power dissipation comprising an injector transistor capable of keeping a high carrier injection efficiency even at sufficiently high injection current.

Another object of the present invention is to provide an integrated injection logic type semiconductor integrated circuit requiring a small power for clocking.

Another object of the present invention is to provide an integrated injection logic type semiconductor integrated circuit comprising an injector transistor capable of supplying a large injection current at a low voltage.

According to an aspect of the present invention, an injector transistor is formed with a junction type field effect transistor having a channel formed integratedly in the base region of an inverter transistor.

According to another aspect of the present invention, an injector transistor is formed with an insulated gate type field effect transistor having a channel formed in the emitter or base region of an inverter transistor and electrically connected to the base of this inverter transistor.

The above and other objects, features and advantages of the present invention will become apparent from the following description of the preferred embodiments when taken in conjunction with the accompanying drawings.

DESCRIPTION OF THE PREFERRED EMBODIMENTS

Figure 1:
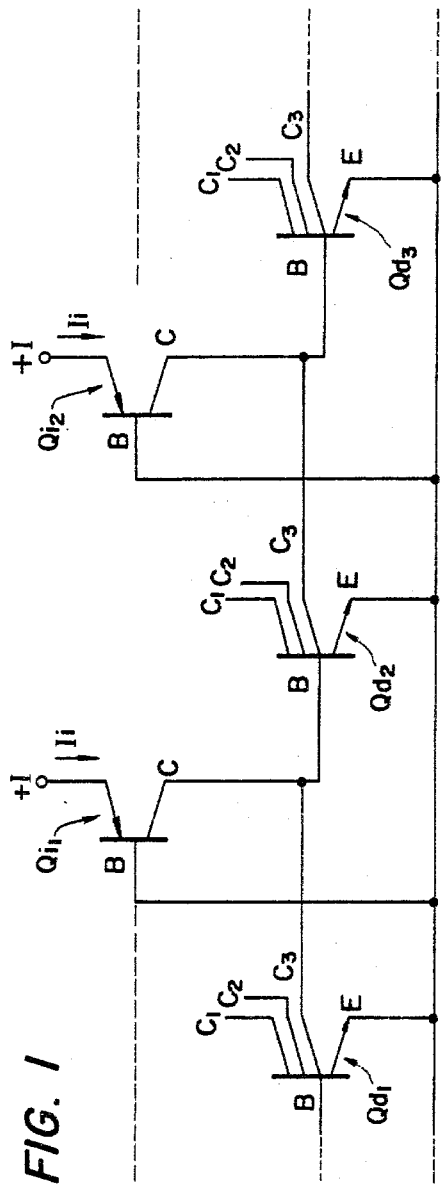
FIG. 1 is a circuit diagram of an example of the prior art IIL circuit.
Figure 2:
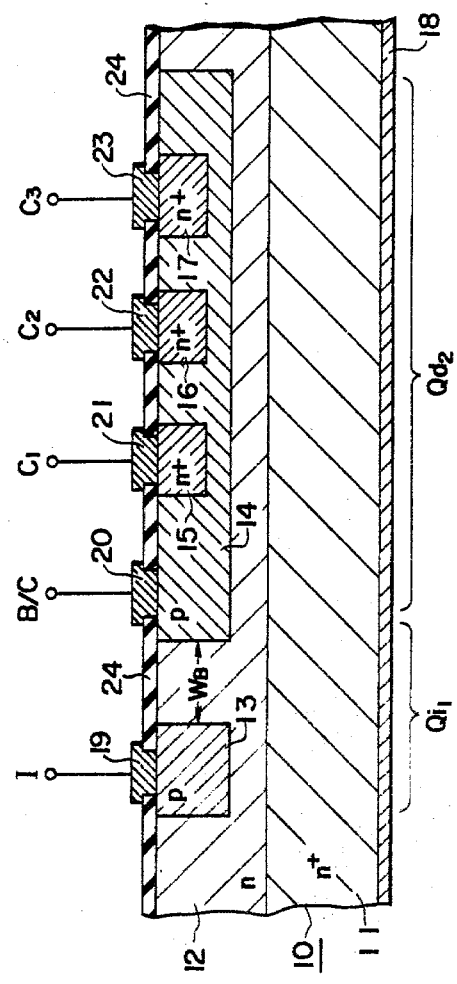
FIG. 2 is a partial longitudinal cross-section of an example structure of the prior art semiconductor integrated circuit having the electric connection shown in FIG. 1.
Figure 3:
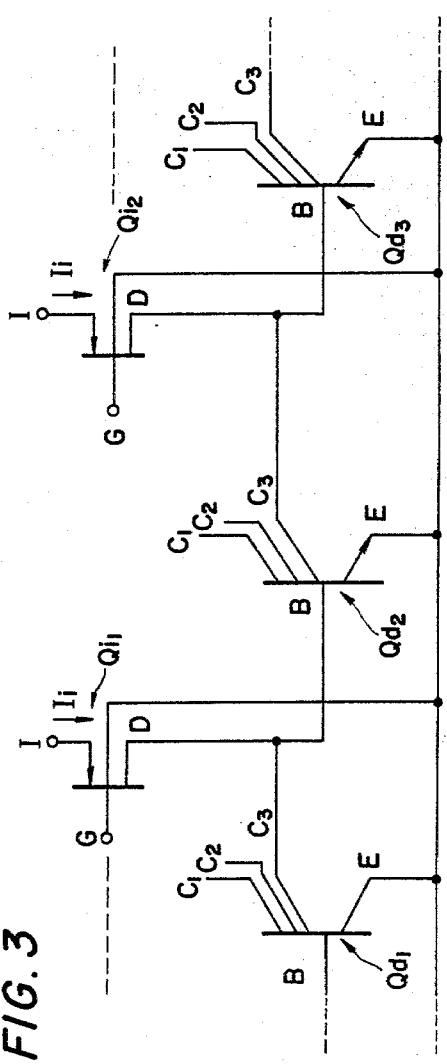
FIG. 3 is a circuit diagram of an IIL type semiconductor integrated circuit according to an embodiment of the present invention.

FIG. 3 shows an embodiment of the integrated injection logic type semiconductor integrated circuit in which injector transistors $Qi_1$, $Qi_2$, ... are formed of field effect transistors. Similar functional parts as those of FIG. 1 are denoted by similar numerals and reference characters.

Figure 4:
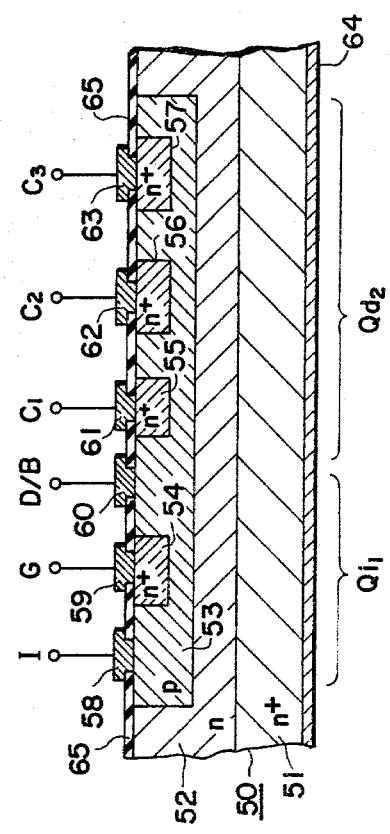
FIGS. 4 and 5 are partial longitudinal cross-sections of structures of the semiconductor integrated circuit having the circuit connection of FIG. 3.

An example of the cross-sectional structure of the integrated injection logic semiconductor circuit device having the circuit connection of FIG. 3 is shown in FIG. 4.

In FIG. 4, a semiconductor wafer 50 is comprised of an n-type semiconductor substrate 51 of a low resistivity and an n-type epitaxial semiconductor layer 52 of a relatively high resistivity grown on the substrate 51. Here, a similar structure may be formed by relying on a diffusion technique (diffusing n+-type region 51 in a high resistivity wafer). In the high resistivity semiconductor region 52, a p-type region 53 of a relatively low resistivity is formed by relying on the selective diffusion or like techniques. In the p-type region 53, n-type regions 54, 55, 56 and 57 are formed by relying on the selective diffusion technique of like techniques. Metal electrodes 58 and 60, 59, 61, 62 and 63 are formed on the p-type region 53 and the n-type regions 54, 55, 56 and 57, by the vacuum deposition or like techniques. Another electrode 64 is formed on the lower surface of the n-type semiconductor substrate 51. Numeral 65 denotes an oxide film.

The lefthand part of FIG. 4 constitutes a p-channel junction type field effect transistor serving as an injector $Qi_1$. Namely, the n-type region 54 serves as gate region, and such portions of the p-type region 53 adjacent to the electrode 58, below the gate region 54 and adjacent to the electrode 60 serve as a source, a channel and a drain, respectively.

The righthand part of FIG. 4 constitutes a bipolar inverter transistor $Qd_2$. Namely, the n-type regions 51 and 52, the p-type region 53 and the n-type regions 55, 56 and 57 serve as an emitter, a base and a plurality of collectors, respectively. In other words, these regions constitute a vertical, multi-collector bipolar transistor.

Operation of this semiconductor circuit device will be described hereinbelow. According to the characteristic feature of the present invention, a positive voltage is applied to the injection electrode I which is connected to the p-type region 53 of the injector transistor $Qi_1$. Assume now that the inverter transistor $Qd_1$ of the preceding stage is turned off. In this state, when clock pulses are applied to the gate electrode of the injector transistor $Qi_1$, carriers are injected intermittently to the base region of the inverter transistor $Qd_2$ (i.e. the drain region of the injector FET $Qi_1$) through the channel of the injector transistor $Qi_1$ in synchronism with the clock pulses. Thus, the inverter transistor $Qd_2$ is turned on and off in synchronism with the clock pulses, then can store the on-off state temporarily in a load capacitance and transfers the stored state to the next stage by the arrival of the next clock pulse. When the inverter transistor $Qd_1$ of the preceding stage is turned on, the injected carriers of the injector transistor $Qi_1$ are absorbed in (or allowed to flow through) the inverter transistor $Qd_1$ of the preceding stage and hence the driver transistor $Qd_2$ of the following stage is kept in the off-state. The clock pulses are not necessarily applied to the gate electrodes G of the injector transistors $Qi_1$, $Qi_2$, ... but they may also be applied to the injection electrodes I with the gate electrodes G connected to an appropriate potential point, e.g. to the common emitter electrode E of the inverter transistors $Qd_1$, $Qd_2$, .... Here, it is to be noted that the power required for clocking can be smaller when the clock pulses are applied to the gate electrodes G.

Figure 5:
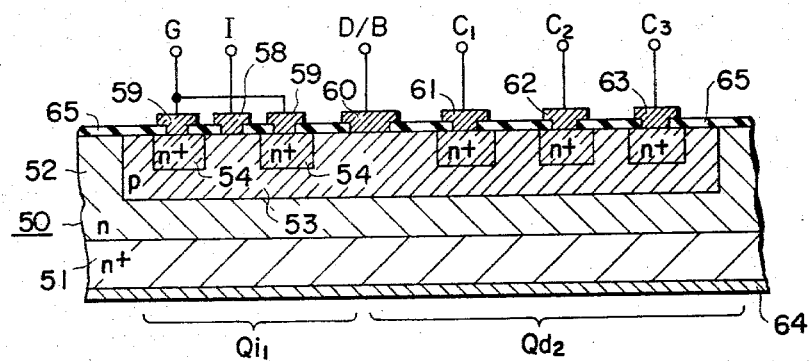

FIG. 5 shows another example structure of the integrated injection logic type semiconductor circuit device, in which the injector transistors $Qi_1$, $Qi_2$, ... are formed with vertical, p-channel, junction type field effect transistors. In FIG. 5, an n-type gate region 54 is formed in a ring shape or a pair of parallel regions. The portion of the p-type region 53 surrounded by the n-type gate region 54 serves as a p-channel. The shape of the gate region 54 may be any one, provided that the channel region is substantially surrounded by the gate region. Other portions of the structure of FIG. 5 are similar to those of FIG. 4.

Figure 6:
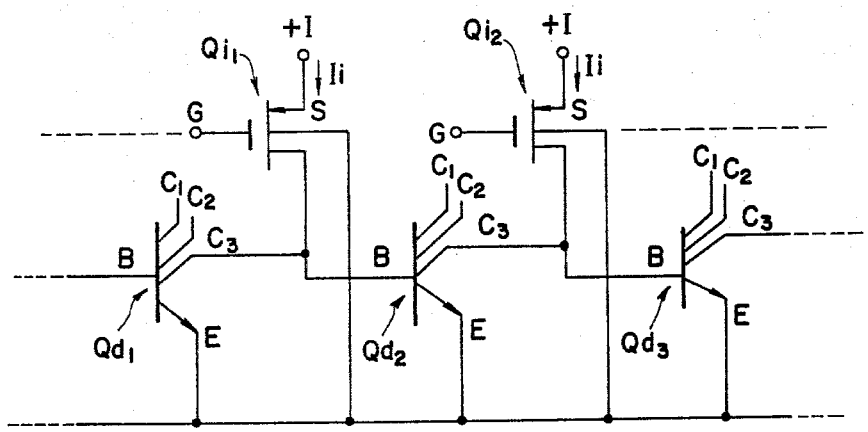
FIG. 6 is a circuit diagram of an IIL type semiconductor integrated circuit according to another embodiment of the present invention.

FIG. 6 shows another embodiment of the integrated injection logic type semiconductor circuit device in which injector transistors $Qi_1$, $Qi_2$, ... are formed with insulated gate type field effect transistors. Other respects are similar to those of the embodiment of FIG. 3.

Figure 7:
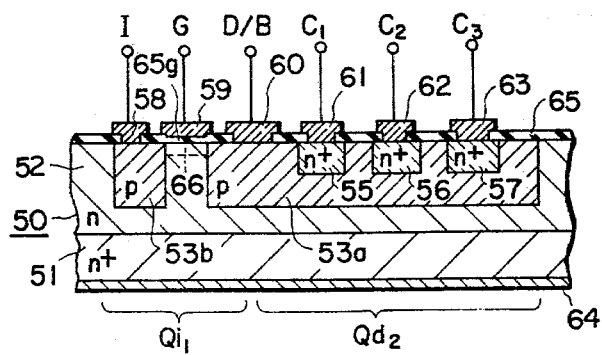
FIG. 7 is a partial longitudinal cross-section of a structure of the semiconductor integrated circuit having the circuit connection of FIG. 6.

FIG. 7 shows an example structure of the integrated injection logic type semiconductor circuit device of FIG. 6. In these figures, similar parts as those of FIGS. 4 and 5 are denoted by similar reference numerals.

In FIG. 7, in an n-type region 52 of the n-type semiconductor wafer 50, p-type semiconductor regions 53a and 53b of a relatively low resistivity are formed by selective diffusion. In one 53a of these p-type regions, n-type regions 55, 56 and 57 of a further low resistivity are formed by the selective diffusion or like techniques. The n-type regions 51 and 52, the p-type region 53a and the n-type regions 55, 56 and 57 form an emitter, a base and a plurality of collector regions of an npn-type bipolar inverter transistor $Qd_2$, respectively. On the other hand, the p-type region 53b and the p-type region 53a adjacent to the electrode 60 form a source and a drain region of the injector transistor $Qi_1$. More particularly, a gate electrode 59 is formed through an insulating film 65 on the portion of the n-type region 52 locating between the p-type regions 53a and 53b and a p-channel 66 is induced in the n-type region 52 under the gate electrode 59. Thus, the p-channel 66 is electrically connected to the base region 53a of the inverter transistor.

In the embodiment of FIG. 7, according to the present invention, the dimensions and the carrier concentrations are selected to be within particular value ranges as described below to ensure the intended operation. The substrate region 51 has an impurity concentration of $10^{24}$–$10^{27}$ atoms/m³. The n-type region 52 has an impurity concentration of $10^{21}$–$10^{23}$ atoms/m³. The source (injection) region 53b and the drain (extraction) region/base region 53a have a depth of 1–3 µm and an impurity concentration of $10^{23}$–$10^{25}$ atoms/m³. The collector regions 55, 56 and 57 have a depth of 0.5–2 µm and impurity concentration of $10^{25}$–$10^{27}$ atoms/m³. The portion of the region 52 sandwiched between the source region 53b and the drain/base region 53a has a length (horizontal direction in FIG. 7) of, for example, 10 µm (which value can be selected over a considerably wide range according to the invention). The portion of the region 52 sandwiched between the drain/base region 53a and the substrate region 51 has a thickness of 0.5–3 µm to be the emitter of the npn transistor. The portion of the drain/base region 53a sandwiched between the collector regions 55, 56, 57 and the emitter region 52 has a thickness of 0.5–1 µm to be the base of the npn transistor.

Figure 8:
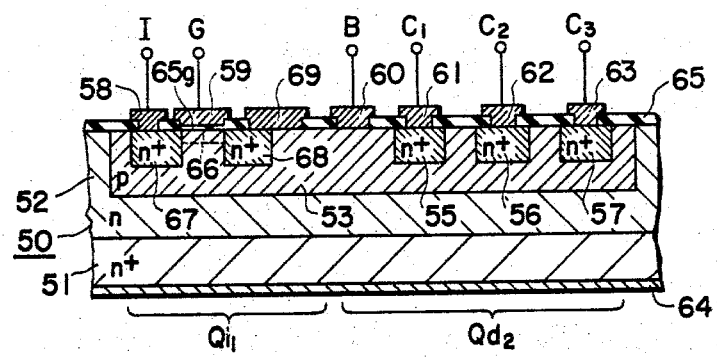
FIG. 8 is a partial longitudinal cross-section of a semiconductor integrated circuit structure of another embodiment similar to FIG. 7.

FIG. 8 shows another example structure similar to that shown in FIG. 7, in which injector transistors $Qi_1$, $Qi_2$, ... are formed of n-channel insulated gate type field effect transistors, an n-type drain region 67 and an n-type source region 68 are formed in a p-type semiconductor region 53 and a metal electrode 69 connects the n-type region 68 and the p-type region 53 to bring them at the equal potential. The n-channel 66 is induced in the p-type region 53. Thus, the n-channel 66 is electrically connected to the base region 53 of the inverter transistor $Qd_2$ through the electrode 69.

Operations of these example structures are similar to those of the preceding embodiment, and therefore they are omitted here.

Figure 10:
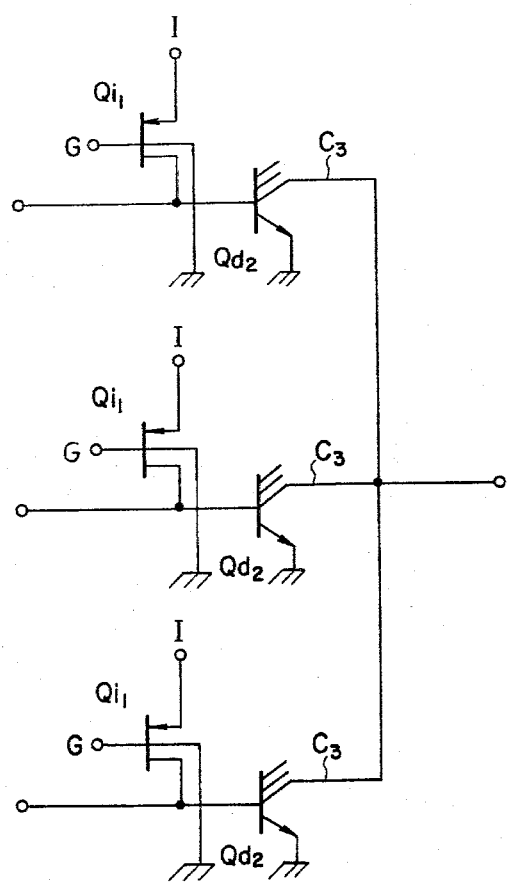
FIG. 10 is a circuit diagram of a logic circuit constituted by the devices according to the present invention.
Figure 11:
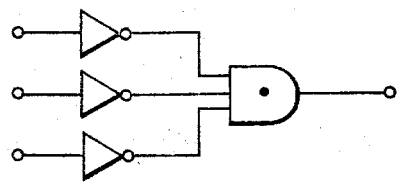
FIG. 11 is a logic diagram of the circuit shown in FIG. 10.

The semiconductor circuits according to above-mentioned various embodiments of the present invention are useful for various logics. Plural collectors of one inverter transistor provide independently separated same outputs which are to be connected to different succeeding circuits. If the collectors of plural inverter transistors (one collector per one inverter transistor) are connected together in a wired AND fashion as shown in FIG. 10, there is constituted a logic circuit whose equivalent logic diagram is as shown in FIG. 11. Thus there is obtained a NOR logic circuit.

Figure 9:
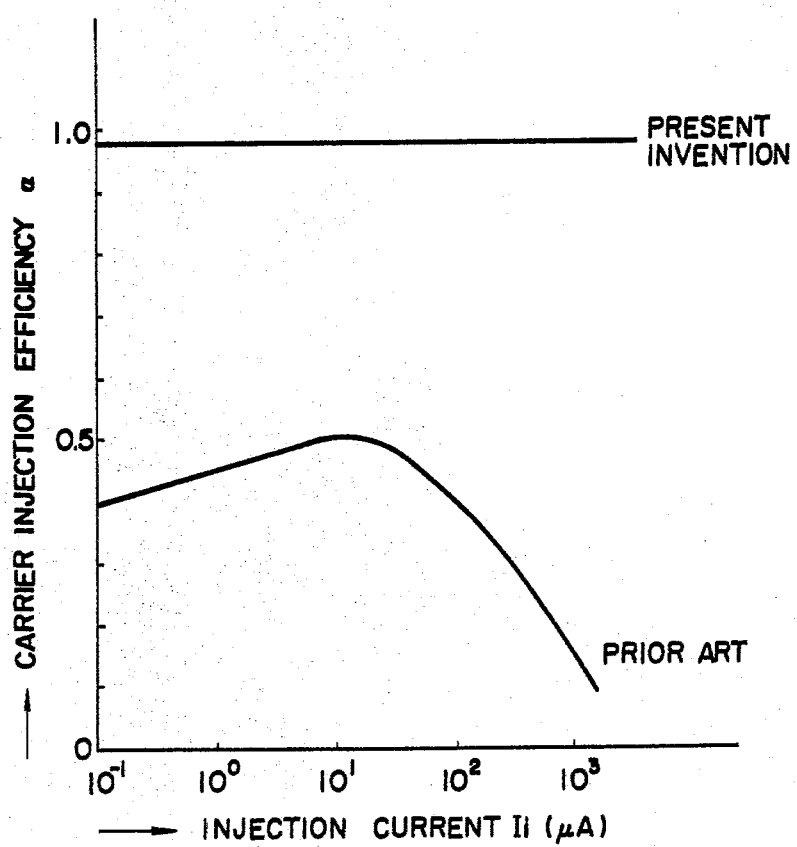
FIG. 9 is a graph of the carrier injection efficiency vs. injection current characteristics of the prior art IIL and the inventive IIL.

As has been described above, according to the embodiments of the present invention, the injector transistors in the integrated injection logic circuit are formed of field effect transistors. Thereby, the following advantages are provided. First, since the injector transistor injects carriers through a channel connected to the base of the inverter transistor, leakage component of the carrier is extremely small compared to the total current, and hence the carrier injection efficiency is excellent as shown in FIG. 9. Furthermore, this excellent carrier injection efficiency is held substantially constant over a wide region of the injection current Ii. Therefore, power dissipation is reduced remarkably and the integration density and the stability of operation are much improved. For increasing the switching speed of the integrated injection logic circuit, the amount of injected carriers should by increased and the charge-discharge time constant associated with the load capacitance should be reduced. The above-mentioned advantages are particularly effective for such purposes. Here, it will be apparent that the injector transistor itself has no carrier storage effect.

The source-to-drain resistance of the injector transistor in the on-state can be selected at a substantially constant and low value irrespective of the injection current. Thereby, it is possible to allow the flow of an injection current comparable with or larger than that of the bipolar injector transistor by appling a lower voltage to the injection electrode. Namely, the injection current (i.e. the emitter current) in a bipolar transistor has a tendency of increasing exponentially with the increase in the applied voltage. For allowing the flow of the same amount of the injection current under the normal operation conditions, a higher voltage is required for a bipolar transistor than for a field effect transistor.

Furthermore, as a result of employing a field effect transistor as the injector transistor, the gate electrode can be utilized as the clocking control electrode. This exhibits a large effect in constituting a dynamic logic system. Namely, with the injection electrode connected to a constant voltage source, clocking can be achieved by applying clock pulses to a high impedance gate electrode. Thus, clocking can be achieved by an extremely small power and the clocking circuit can be extremely simplified and minimized in size.

As has been described above, according to the present invention, there is provided an integrated injection logic circuit solving the conventional problems, and having excellent operation characteristics and being easy to manufacture.

The above embodiments should not be read in any limitative way, and many alterations are possible within the scope of the present invention. For example, the conductivity types of the respective regions may apparently be reversed to constitute complementary structures.

We claim:

1. A semiconductor integrated circuit device formed in a common semiconductor wafer having a pair of principal surfaces, comprising:
   a first semiconductor region of a first conductivity type disposed adjacent to one of said principal surfaces,
   a second semiconductor region of a second conductivity type opposite to said first conductivity type disposed adjacent to said first semiconductor region between said first semiconductor region and the other of said principal surfaces, said first and second semiconductor regions forming a PN junction therebetween,
   a third semiconductor region of said first conductivity type disposed in said second semiconductor region and adjacent to said other principal surface,
   a fourth and a fifth semiconductor region of said second conductivity type disposed adjacent to each other, said fourth semiconductor region being disposed adjacent to said second semiconductor region, while the fifth semiconductor region is separated from said second semiconductor region by said fourth semiconductor region,
   a sixth semiconductor region of said first conductivity type disposed adjacent to said fourth semiconductor region,
   a seventh semiconductor region of said first semiconductor type disposed adjacent to said fourth semiconductor region, and electrically connected to said sixth semiconductor region, said sixth and seventh regions substantially surrounding said fourth semiconductor region and at least part of said fifth semiconductor region, thereby forming a vertically oriented current path in said fourth semiconductor region,
   an injection electrode formed on said fifth semiconductor region and electrically isolated from sixth semiconductor region, and
   means for applying a biasing potential between said injection electrode and said first semiconductor region of such polarity as to forward bias the PN junction between said first and second semiconductor regions.

2. A semiconductor integrated circuit device according to claim 1, wherein:
   said fifth and sixth semiconductor regions are located at said other of the principle surfaces, and said second, fourth and fifth semiconductor regions are formed with one common region.

3. A semiconductor integrated circuit device according to claim 2, further comprising:
   an injection control electrode formed on said sixth semiconductor region for controlling said current path in said fourth semiconductor region.

4. A semiconductor integrated circuit device according to claim 3, further comprising electrodes disposed on said second and third semiconductor regions.

5. A semiconductor integrated circuit device according to claim 1, where in said sixth and seventh semiconductor region is formed in said second semiconductor region.

6. A semiconductor integrated circuit device formed in a common semiconductor wafer having a pair of principal surfaces, comprising:
   a first semiconductor region of a first conductivity type disposed adjacent to one of said principal surfaces,
   a second semiconductor region of a second conductivity type opposite to said first conductivity type, disposed adjacent to said first semiconductor region between said first semiconductor region and the other of said principal surfaces, said first and second semiconductor regions forming a PN junction therebetween,
   a third semiconductor region of said first conductivity type disposed in said second semiconductor region and adjacent to said other of the principal surfaces,
   a fourth and a fifth semiconductor region of said first conductivity type disposed in said second semiconductor region separated from each other by a portion of said second semiconductor region and adjacent to said other of the principal surfaces,
   an insulated electrode structure formed on said second semiconductor region between said fourth and fifth semiconductor regions,
   an electrode formed on and contacting simultaneously another portion of said second semiconductor region and said fourth semiconductor region,
   another electrode formed on said third semiconductor region, and,
   means for applying a biasing potential between said fifth semiconductor region and said first semiconductor region of such polarity as to forward bias the PN junction between said first and second semiconductor regions.

* * * * *

UNITED STATES PATENT AND TRADEMARK OFFICE
CERTIFICATE OF CORRECTION

PATENT NO. : 4,255,671
DATED : March 10, 1981
INVENTOR(S) : Terumoto NONAKA; Takashi YOSHIDA & Takeshi MATSUYAMA It is certified that error appears in the above—identified patent and that said Letters Patent is hereby corrected as shown below:

Column 8:

Claim 5, line 19, read "region" as --regions-- line 19, read "is" as --are--

Signed and Sealed this

Thirteenth Day of October 1981

[SEAL]

Attest:

GERALD J. MOSSINGHOFF

Attesting Officer      Commissioner of Patents and Trademarks